(12) United States Patent
Chen et al.

(10) Patent No.: US 11,140,983 B2
(45) Date of Patent: Oct. 12, 2021

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shih-Lung Huang, Kaohsiung (TW); Chien-Hung Kuo, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 16/892,676

(22) Filed: Jun. 4, 2020

(65) Prior Publication Data
US 2021/0251385 A1    Aug. 19, 2021

(30) Foreign Application Priority Data

Feb. 14, 2020    (TW) ................................ 109104916

(51) Int. Cl.
| A47B 88/45 | (2017.01) |
| A47B 88/403 | (2017.01) |
| A47B 88/493 | (2017.01) |

(52) U.S. Cl.
CPC .......... *A47B 88/403* (2017.01); *A47B 88/493* (2017.01); *A47B 2210/0032* (2013.01); *A47B 2210/0059* (2013.01); *A47B 2210/0081* (2013.01)

(58) Field of Classification Search
CPC ..... A47B 88/45; A47B 88/403; A47B 88/443; A47B 88/493
USPC ........................... 312/334.8, 334.44, 334.47
See application file for complete search history.

(56) References Cited

U.S. PATENT DOCUMENTS

| 4,872,734 | A | 10/1989 | Rechberg | |
| 5,871,265 | A | 2/1999 | Stewart et al. | |
| 8,132,875 | B2 * | 3/2012 | Juang | A47B 88/49 312/334.47 |
| 8,511,765 | B1 | 8/2013 | Chen et al. | |
| 8,733,864 | B2 | 5/2014 | Chen et al. | |
| 9,279,280 | B1 * | 3/2016 | Chen | A47B 88/40 |
| 2007/0164644 | A1 | 7/2007 | Hwang et al. | |
| 2011/0135224 | A1 | 6/2011 | Chen et al. | |
| 2014/0265792 | A1 | 9/2014 | Chiu | |

FOREIGN PATENT DOCUMENTS

TW             566128 U      12/2003

* cited by examiner

*Primary Examiner* — James O Hansen
(74) *Attorney, Agent, or Firm* — Rosenberg, Klein & Lee

(57) ABSTRACT

A slide rail assembly includes a first rail, a second rail displaceable with respect to the first rail, a third rail displaceable with respect to the second rail, a working member movably mounted on the second rail and switchable between two states, and a contact feature on the third rail. The third rail can be displaced from a retracted position to an extended position in a first direction, and when the third rail is displaced from the extended position to the retracted position in a second direction, the contact feature is brought into contact with the working member in one of the two states so as to drive and thereby retract the second rail with respect to the first rail in the second direction.

19 Claims, 15 Drawing Sheets

SLIDE RAIL ASSEMBLY

FIELD OF THE INVENTION

The present invention relates to a slide rail assembly and more particularly to one that allows opening in two directions, or a two-way slide rail assembly.

BACKGROUND OF THE INVENTION

FIG. 1 to FIG. 4 of U.S. Pat. No. 5,871,265 disclose a conventional two-way slide assembly that includes an outer slide member, an inner slide member, and an intermediate slide member mounted between the outer slide member and the inner slide member. As shown in FIG. 4 of the US patent, the arm at one end of the intermediate slide member is provided with two end stops, and the intermediate slide member is prevented from traveling in a certain direction when one of the two end stops contacts the inner slide member. With relatively wide cross sections, however, the slide members take up a considerable amount of space when mounted between a drawer and a cabinet body and may therefore have a negative effect on the storage capacity of the drawer.

As a solution to the problem stated above, the embodiment shown in FIG. 5 to FIG. 12 of the afore-cited US patent discloses a sequencing latch for preventing the intermediate slide member of a drawer slide assembly from protruding from either end of a two-way cabinet (or rack). When the inner slide member of the drawer slide assembly is moved, the cams on the inner slide member apply a force to a latching arm on the intermediate slide member until the latching arm pivots through an aperture in the intermediate slide member and engages with a receptacle of the outer slide member. While the use of the cams and the receptacle allows for bi-directional travel limitation of the intermediate slide member, the latching mechanism of the sequencing latch shortens the distance for which the intermediate slide member can be displaced, making it relatively inconvenient for a user to access the objects in the drawer.

SUMMARY OF THE INVENTION

The present invention relates to a slide rail assembly that allows opening in two directions and whose design has no negative effect on the distance for which each movable rail of the assembly can be displaced.

According to one aspect of the present invention, a slide rail assembly includes a first rail, a second rail, a third rail, a first auxiliary structure, a first working member, and a first contact feature. The second rail can be displaced with respect to the first rail, and the third rail with respect to the second rail. The first auxiliary structure is disposed on the first rail. The first working member is movably mounted on the second rail and is configured to be in either one of a first state and a second state with respect to the second rail. The first contact feature is disposed on the third rail. When the third rail is at a retracted position with respect to the first rail, the second rail is retracted with respect to the first rail, and the first working member is in the first state. In the course in which the third rail is displaced from the retracted position to a first extended position in a first direction, the first working member in the first state is brought into contact with the first auxiliary structure and is thus switched from the first state to the second state. In the course in which the third rail is displaced from the first extended position to the retracted position in a second direction, which is the opposite direction of the first direction, the first contact feature on the third rail is brought into contact with the first working member in the second state so as to drive and thereby retract the second rail with respect to the first rail in the second direction.

Preferably, the slide rail assembly further includes a second working member movably mounted on the second rail and a second contact feature disposed on the third rail. The second working member is configured to be in either one of the first state and the second state with respect to the second rail and is in the first state when the third rail is at the retracted position with respect to the first rail. In the course in which the third rail is displaced from the retracted position to the first extended position in the first direction, the second contact feature on the third rail is brought into contact with the second working member in the first state to displace the second rail in the first direction.

Preferably, the slide rail assembly further includes a first guiding feature disposed on the first rail. In the course in which the second rail is displaced in the first direction, the second working member in the first state is brought into contact with the first guiding feature and is thus switched from the first state to the second state so that the second contact feature can move past the second working member in the second state in the first direction.

Preferably, the first working member and the second working member are pivotally connected to the second rail.

Preferably, the first working member is disposed adjacent to a front portion of the second rail, and the second working member is disposed adjacent to a rear portion of the second rail.

Preferably, the first contact feature is disposed adjacent to a front portion of the third rail, and the second contact feature is disposed adjacent to a rear portion of the third rail.

Preferably, the third rail includes an upper wall, a lower wall, and a longitudinal wall connected between the upper wall and the lower wall of the third rail, and the first contact feature and the second contact feature are adjacent to the upper wall and the lower wall of the third rail respectively.

Preferably, the first auxiliary structure is disposed adjacent to a front portion of the first rail, and the first guiding feature is disposed adjacent to a rear portion of the first rail.

Preferably, the first rail includes an upper wall, a lower wall, and a longitudinal wall connected between the upper wall and the lower wall of the first rail, and both the first auxiliary structure and the first guiding feature are adjacent to the upper wall of the first rail.

Preferably, the slide rail assembly further includes a second auxiliary structure and a second guiding feature. In the course in which the third rail is displaced from the retracted position to a second extended position in the second direction, the second working member in the second state is brought into contact with the second auxiliary structure and is thus switched from the second state to the first state. In the course in which the third rail is displaced from the second extended position to the retracted position in the first direction, the second contact feature on the third rail is brought into contact with the second working member in the first state so as to drive and thereby retract the second rail with respect to the first rail in the first direction.

Preferably, in the course in which the third rail is displaced from the retracted position to the second extended position in the second direction, the first contact feature on the third rail is brought into contact with the first working member in the second state to displace the second rail in the second direction.

Preferably, in the course in which the second rail is displaced in the second direction, the first working member in the second state is brought into contact with the second guiding feature and is thus switched from the second state to the first state so that the first contact feature can move past the first working member in the first state in the second direction.

Preferably, the second auxiliary structure is disposed adjacent to the rear portion of the first rail, and the second guiding feature is disposed adjacent to the front portion of the first rail.

Preferably, both the second auxiliary structure and the second guiding feature are adjacent to the lower wall of the first rail.

Preferably, the slide rail assembly further includes a first slide facilitating device movably mounted between the first rail and the second rail and a second slide facilitating device movably mounted between the second rail and the third rail.

Preferably, the first rail is provided with a first blocking feature, and the second rail is provided with a second blocking feature so that when the second rail is at a first predetermined position, a front section and a rear section of the first slide facilitating device are located between and abut respectively against the first blocking feature and the second blocking feature. Preferably, the second rail is provided with a third blocking feature, and the third rail is provided with a fourth blocking feature so that when the third rail is at the first extended position, a front section and a rear section of the second slide facilitating device are located between and abut respectively against the third blocking feature and the fourth blocking feature.

Preferably, the first rail is provided with a fifth blocking feature, and the second rail is provided with a sixth blocking feature so that when the second rail is at a second predetermined position, the rear section and the front section of the first slide facilitating device are located between and abut respectively against the fifth blocking feature and the sixth blocking feature. Preferably, the second rail is provided with a seventh blocking feature, and the third rail is provided with an eighth blocking feature so that when the third rail is at the second extended position, the rear section and the front section of the second slide facilitating device are located between and abut respectively against the seventh blocking feature and the eighth blocking feature.

According to another aspect of the present invention, a slide rail assembly includes a first rail, a second rail, a third rail, a working member, and a contact feature. The second rail can be displaced with respect to the first rail, and the third rail with respect to the second rail. The working member is movably mounted on the second rail and can be switched between two states with respect to the second rail. The contact feature is disposed on the third rail. The third rail can be displaced from a retracted position to a first extended position in a first direction, and in the course in which the third rail is displaced from the first extended position to the retracted position in a second direction, which is the opposite direction of the first direction, the contact feature on the third rail is brought into contact with the working member in one of the two states so as to drive and thereby retract the second rail with respect to the first rail in the second direction.

Preferably, the working member is pivotally connected with respect to the second rail via a shaft whose extending direction is substantially the same as the length direction of the second rail, and an auxiliary structure is disposed on the first rail. In the course in which the third rail is displaced from the retracted position to the first extended position in the first direction, the working member in the other one of the two states is brought into contact with the auxiliary structure and is thus switched from the other one to the one of the two states.

Preferably, the slide rail assembly further includes a guiding feature disposed on the first rail. In the course in which the third rail is displaced from the retracted position to a second extended position in the second direction, the contact feature on the third rail is brought into contact with the working member in the one of the two states to help displace the second rail in the second direction, and in the course in which the second rail is displaced in the second direction, the working member in the one of the two states is brought into contact with the guiding feature and is thus switched from the one to the other one of the two states so that the contact feature can move past the working member in the other one of the two states in the second direction.

DETAILED DESCRIPTION OF THE INVENTION

Figure 1:
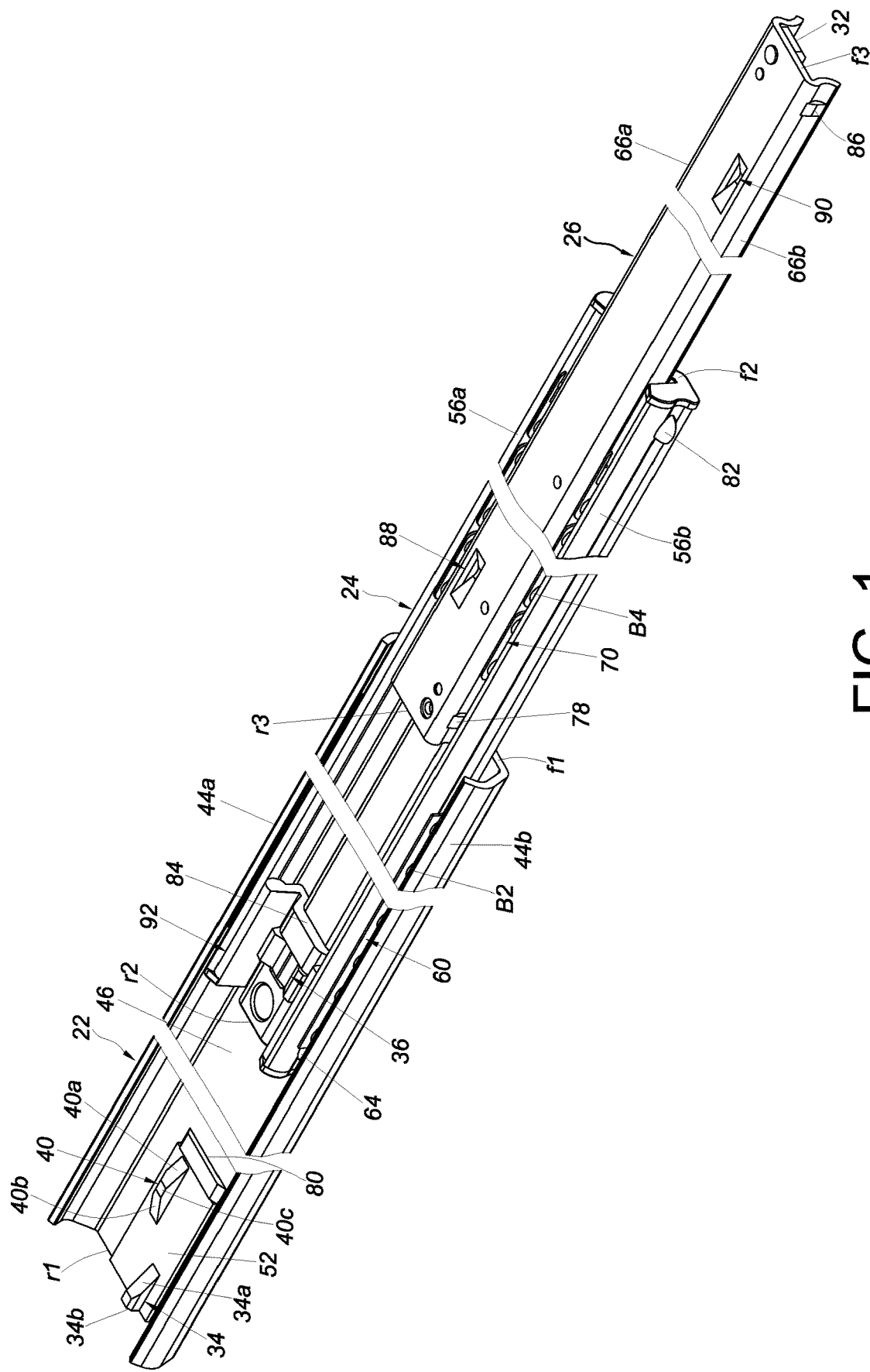
FIG. 1 is a perspective view of the slide rail assembly according to an embodiment of the present invention.
Figure 2:
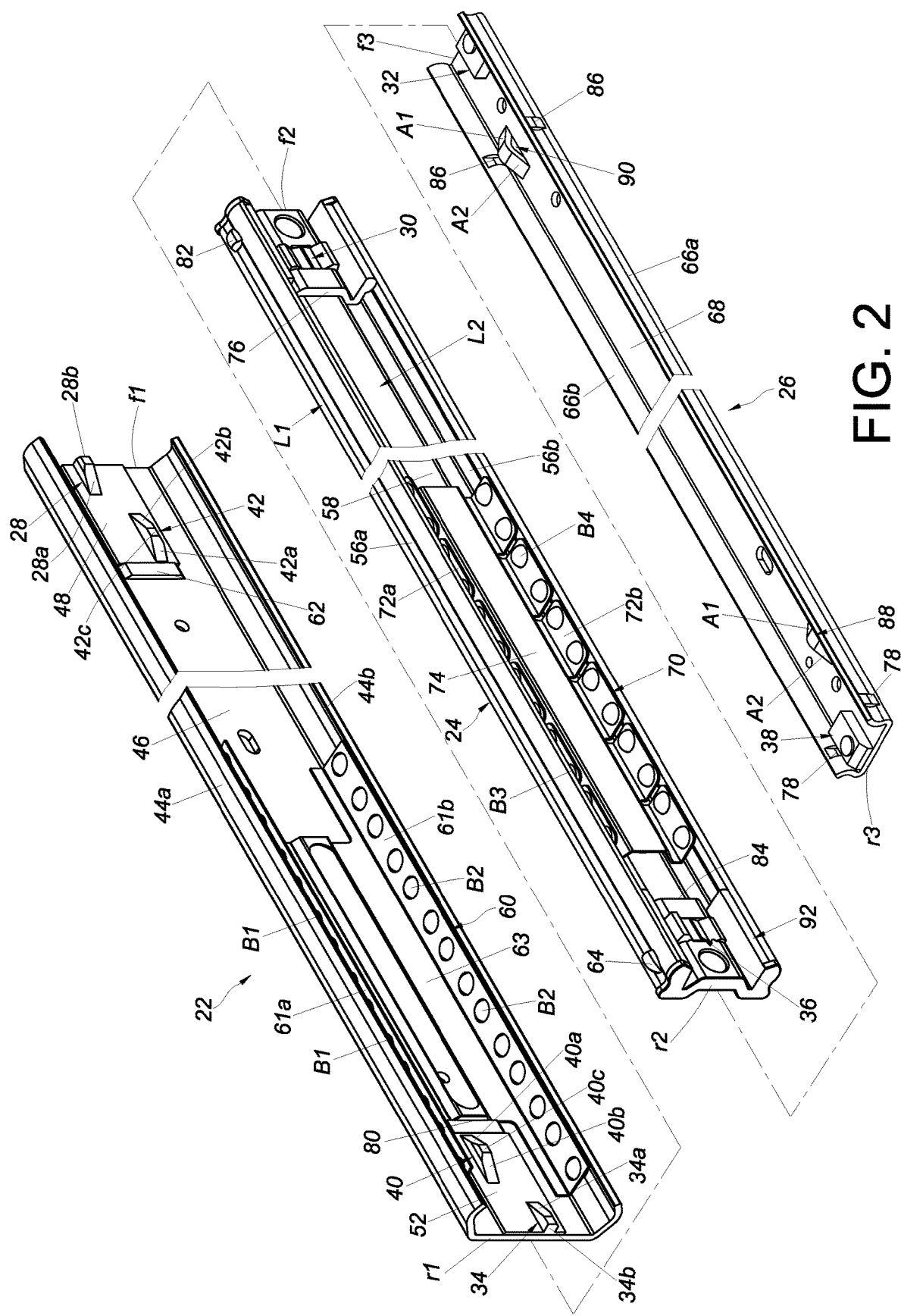
FIG. 2 is an exploded perspective view of the slide rail assembly according to the embodiment of the present invention, showing in particular the first rail, the second rail, and the third rail of the slide rail assembly.

Referring to FIG. 1 and FIG. 2, the slide rail assembly according to an embodiment of the present invention includes a first rail 22, a second rail 24, a third rail 26, a first auxiliary structure 28, a first working member 30, and a first contact feature 32. Preferably, the slide rail assembly further includes a second auxiliary structure 34, a second working member 36, a second contact feature 38, a first guiding feature 40, and a second guiding feature 42.

The first rail 22 has a front portion f1 and a rear portion r1. The first rail 22 includes an upper wall 44a, a lower wall 44b, and a longitudinal wall 46 connected between the upper wall 44a and the lower wall 44b of the first rail 22. The upper wall 44a, the lower wall 44b, and the longitudinal wall 46 of the first rail 22 jointly define a first channel.

Preferably, the first auxiliary structure 28 and the second guiding feature 42 are provided on the first rail 22, e.g., adjacent to the front portion f1 of the first rail 22. Here, by way of example, the first auxiliary structure 28 and the second guiding feature 42 are integrated into a first component 48, and the first component 48 is connected to the first rail 22 at a position adjacent to the front portion f1. In an alternative embodiment, the first auxiliary structure 28 and the second guiding feature 42 are two independent portions directly integrated into the first rail 22. The present invention has no limitation on how the first auxiliary structure 28 and the second guiding feature 42 are provided on the first rail 22. Both the first auxiliary structure 28 and the second guiding feature 42 are located in the first channel and protrude transversely with respect to the longitudinal wall 46 of the first rail 22. The first auxiliary structure 28 includes a first auxiliary section 28a and a first wall 28b, which are located at a rear portion and a front portion of the first auxiliary structure 28 respectively. The first auxiliary section 28a is an inclined surface or a curved surface. The second guiding feature 42 includes a first guiding section 42a, a second guiding section 42b, and a middle section 42c connected between the first guiding section 42a and the second guiding section 42b. The middle section 42c has a transverse height with respect to the longitudinal wall 46 of the first rail 22, and each of the first guiding section 42a and the second guiding section 42b is an inclined surface or a curved surface.

Similarly, the second auxiliary structure 34 and the first guiding feature 40 are provided on the first rail 22, e.g., adjacent to the rear portion r1 of the first rail 22.

Here, by way of example, the second auxiliary structure 34 and the first guiding feature 40 are integrated into a second component 52, and the second component 52 is connected to the first rail 22 at a position adjacent to the rear portion r1. In an alternative embodiment, the second auxiliary structure 34 and the first guiding feature 40 are two independent portions directly integrated into the first rail 22. The present invention has no limitation on how the second auxiliary structure 34 and the first guiding feature 40 are provided on the first rail 22. Both the second auxiliary structure 34 and the first guiding feature 40 are located in the first channel and protrude transversely with respect to the longitudinal wall 46 of the first rail 22. The second auxiliary structure 34 includes a second auxiliary section 34a and a second wall 34b, which are located at a front portion and a rear portion of the second auxiliary structure 34 respectively. The second auxiliary section 34a is an inclined surface or a curved surface. The first guiding feature 40 includes a first guiding section 40a, a second guiding section 40b, and a middle section 40c connected between the first guiding section 40a and the second guiding section 40b. The middle section 40c has a transverse height with respect to the longitudinal wall 46 of the first rail 22, and each of the first guiding section 40a and the second guiding section 40b is an inclined surface or a curved surface.

Preferably, both the first auxiliary structure 28 and the first guiding feature 40 are adjacent to the upper wall 44a of the first rail 22, and both the second auxiliary structure 34 and the second guiding feature 42 are adjacent to the lower wall 44b of the first rail 22.

The second rail 24 can be displaced with respect to the first rail 22. Here, the second rail 24 is movably mounted in the first channel of the first rail 22 by way of example. The second rail 24 has a front portion f2 and a rear portion r2. The second rail 24 includes an upper wall 56a, a lower wall 56b, and a longitudinal wall 58 connected between the upper wall 56a and the second wall 56b of the second rail 24. The upper wall 56a, the lower wall 56b, and the longitudinal wall 58 of the second rail 24 jointly define a second channel.

Preferably, both the first working member 30 and the second working member 36 are movably mounted on the second rail 24. Here, by way of example, the first working member 30 and the second working member 36 have substantially the same structural configuration, and both the first working member 30 and the second working member 36 are pivotally connected to the second rail 24. The first working member 30 is provided adjacent to the front portion f2 of the second rail 24, and the second working member 36 is provided adjacent to the rear portion r2 of the second rail 24.

Preferably, the slide rail assembly further includes a first slide facilitating device 60 movably mounted between the first rail 22 and the second rail 24 so that the first rail 22 and the second rail 24 can be displaced with respect to each other smoothly. For example, the first slide facilitating device 60 has an upper portion 61a, a lower portion 61b, and a main body portion 63 connected between the upper portion 61a and the lower portion 61b of the first slide facilitating device 60. The upper portion 61a is provided with a plurality of first upper rolling members B1 (e.g., rolling balls or rolling wheels) supported between the upper wall 44a of the first rail 22 and the upper wall 56a of the second rail 24 in a rollable manner, and the lower portion 61b is provided with a plurality of first lower rolling members B2 (e.g., rolling balls or rolling wheels) supported between the lower wall 44b of the first rail 22 and the lower wall 56b of the second rail 24 in a rollable manner.

Preferably, a first blocking feature 62 is provided on, and adjacent to the front portion f1 of, the first rail 22. Here, the first blocking feature 62 protrudes transversely with respect to the longitudinal wall 46 of the first rail 22 by way of example. It is also preferable that the second rail 24 is provided with at least one second blocking feature 64. Here, by way of example, two second blocking features 64 are located respectively on the upper wall 56a and the lower wall 56b of the second rail 24 and are adjacent to the rear portion r2 of the second rail 24.

The third rail 26 can be displaced with respect to the second rail 24. Here, the third rail 26 is movably mounted in the second channel of the second rail 24 by way of example. The third rail 26 has a front portion f3 and a rear portion r3. The third rail 26 includes an upper wall 66a, a lower wall 66b, and a longitudinal wall 68 connected between the upper wall 66a and the lower wall 66b of the third rail 26.

Preferably, both the first contact feature 32 and the second contact feature 38 are provided on the third rail 26. For example, the first contact feature 32 is provided adjacent to the front portion f3 of the third rail 26, and the second contact feature 38 is provided adjacent to the rear portion r3 of the third rail 26, with the first contact feature 32 being adjacent to the upper wall 66a of the third rail 26, and the second contact feature 38 being adjacent to the lower wall 66b of the third rail 26.

Preferably, the first contact feature 32 and the second contact feature 38 are provided on the longitudinal wall 68 of the third rail 26, and the first contact feature 32 and the second contact feature 38 protrude transversely with respect to the longitudinal wall 68 of the third rail 26 toward the longitudinal wall 58 of the second rail 24.

Preferably, the slide rail assembly further includes a second slide facilitating device 70 movably mounted between the second rail 24 and the third rail 26 so that the second rail 24 and the third rail 26 can be displaced with respect to each other smoothly. For example, the second slide facilitating device 70 has an upper portion 72a, a lower portion 72b, and a main body portion 74 connected between the upper portion 72a and the lower portion 72b of the second slide facilitating device 70. The upper portion 72a is provided with a plurality of second upper rolling members B3 (e.g., rolling balls or rolling wheels) supported between the upper wall 56a of the second rail 24 and the upper wall 66a of the third rail 26 in a rollable manner, and the lower portion 72b is provided with a plurality of second lower rolling members B4 (e.g., rolling balls or rolling wheels) supported between the lower wall 56b of the second rail 24 and the lower wall 66b of the third rail 26 in a rollable manner.

Preferably, a third blocking feature 76 is provided on, and adjacent to the front portion f2 of, the second rail 24. Here, the third blocking feature 76 protrudes transversely with respect to the longitudinal wall 58 of the second rail 24 by way of example. It is also preferable that the third rail 26 is provided with at least one fourth blocking feature 78. Here, by way of example, two fourth blocking features 78 are located respectively on the upper wall 66a and the lower wall 66b of the third rail 26 and are adjacent to the rear portion r3 of the third rail 26.

Preferably, a fifth blocking feature 80 is provided on, and adjacent to the rear portion r1 of, the first rail 22. Here, the fifth blocking feature 80 protrudes transversely with respect to the longitudinal wall 46 of the first rail 22 by way of example. It is also preferable that the second rail 24 is provided with at least one sixth blocking feature 82. Here, by way of example, two sixth blocking features 82 are located respectively on the upper wall 56a and the lower wall 56b of the second rail 24 and are adjacent to the front portion f2 of the second rail 24.

Preferably, a seventh blocking feature 84 is provided on, and adjacent to the rear portion r2 of, the second rail 24. Here, the seventh blocking feature 84 protrudes transversely with respect to the longitudinal wall 58 of the second rail 24 by way of example. It is also preferable that the third rail 26 is provided with at least one eighth blocking feature 86. Here, by way of example, two eighth blocking features 86 are located respectively on the upper wall 66a and the lower wall 66b of the third rail 26 and are adjacent to the front portion f3 of the third rail 26.

Preferably, the third rail 26 is further provided with a first actuating feature 88 and a second actuating feature 90, which are adjacent to the upper wall 66a and the lower wall 66b of the third rail 26 respectively. The first actuating feature 88 and the second actuating feature 90 have substantially the same structural configuration and both protrude with respect to the longitudinal wall 68 of the third rail 26 toward the longitudinal wall 58 of the second rail 24. Take the first actuating feature 88 for example. The first actuating feature 88 has a first actuating section A1 at a front portion and a second actuating section A2 at a rear portion. Each of the first actuating section A1 and the second actuating section A2 is an inclined surface or a curved surface.

Figure 3:
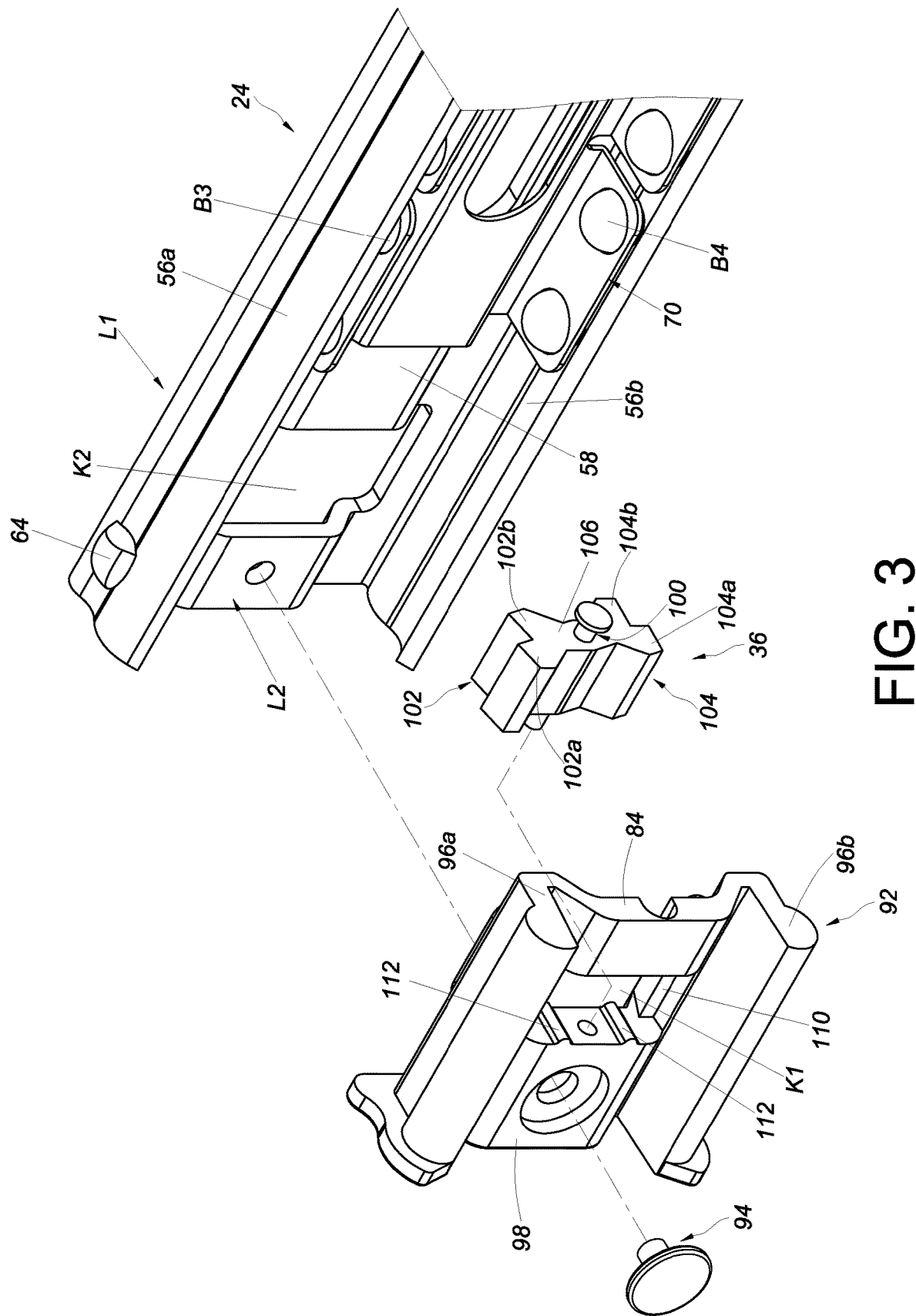
FIG. 3 is a partial exploded perspective view showing in particular the second rail and a working member of the slide rail assembly according to the embodiment of the present invention.

The first working member 30 and the second working member 36 have substantially the same structural configuration, and the principle by which the first working member 30 is mounted on the second rail 24 is substantially the same as that by which the second working member 36 is mounted on the second rail 24. Take the second working member 36 for example. Referring to FIG. 3, the second working member 36 is mounted on a base 92 on the second rail 24. More specifically, the base 92 is connected (e.g., fixedly connected) to the longitudinal wall 58 of the second rail 24 by a connecting member 94 and can therefore be viewed as a part of the second rail 24. The base 92 includes an upper supporting portion 96a, a lower supporting portion 96b, and a side portion 98 connected between the upper supporting portion 96a and the lower supporting portion 96b. The second working member 36 is pivotally connected with respect to the second rail 24 via a shaft 100. For example, the shaft 100 is pivotally connected to the base 92 and extends in a direction that is substantially the same as the length direction of the second rail 24, i.e., both directions are longitudinal directions. The second working member 36 includes an upper working portion 102, a lower working portion 104, and a middle portion 106 connected between the upper working portion 102 and the lower working portion 104.

Preferably, the base 92 has a first space K1, and the second rail 24 (or more particularly its longitudinal wall 58) has a second space K2 corresponding to the first space K1. The first space K1 and the second space K2 bring a first side L1 and a second side L2 of the second rail 24 into communication with each other, wherein the first side L1 faces the first rail 22 (or more particularly its longitudinal wall 46) and the second side L2 faces the third rail 26 (or more particularly its longitudinal wall 68).

Preferably, the second working member 36 is received in the first space K1 of the base 92, and the upper working portion 102 of the second working member 36 branches into a first extension section 102a and a second extension section 102b.

Figure 4:
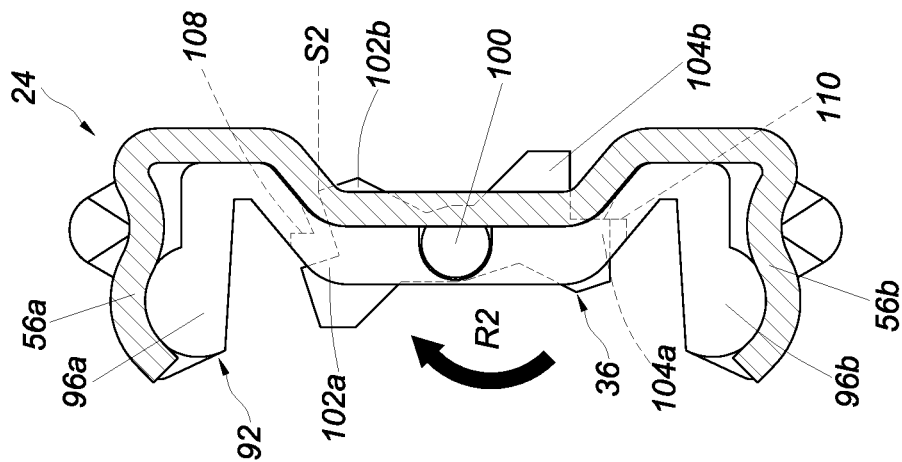
FIG. 4 is a schematic view showing that the working member according to the embodiment of the present invention is in a first state with respect to the second rail.
Figure 5:
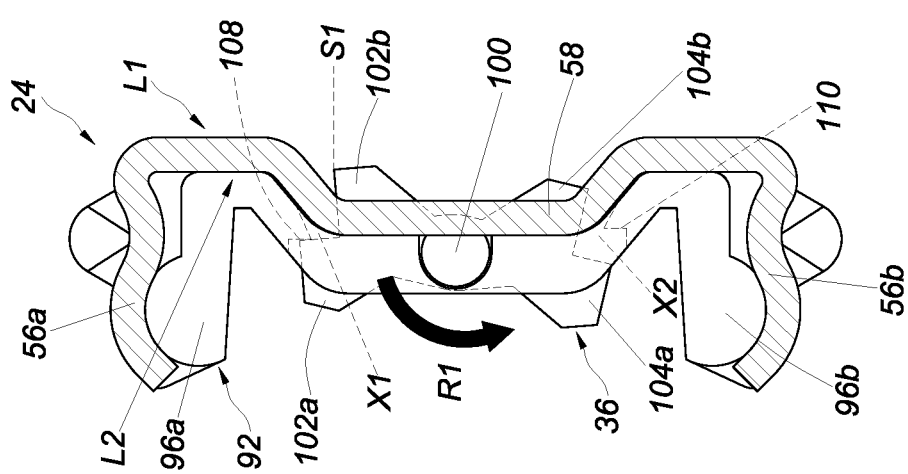
FIG. 5 is a schematic view showing that the working member according to the embodiment of the present invention is in a second state with respect to the second rail.

As shown in FIG. 4 and FIG. 5, each working member (i.e., the first working member 30 or the second working member 36) can be moved and thereby switched between two states with respect to the second rail 24. Take the second working member 36 for example. The second working member 36 can be moved with respect to the second rail 24 and end up in one of a first state S1 (see FIG. 4) and a second state S2 (see FIG. 5). For example, the shaft 100 allows the second working member 36 to pivot from the first state S1 to the second state S2 in a first pivoting direction R1 and from the second state S2 back to the first state S1 in a second pivoting direction R2, which is the opposite direction of the first pivoting direction R1.

Preferably, the second rail 24 (or more particularly the base 92 connected thereto) has an upper blocking portion 108 and a lower blocking portion 110. The first extension section 102a and the second extension section 102b of the upper working portion 102 of the second working member 36 define a first receiving space X1 therebetween for receiving the upper blocking portion 108 of the second rail 24 (or more particularly of the base 92), wherein the upper blocking portion 108 has a smaller size than the first receiving space X1 Similarly, the first extension section 104a and the second extension section 104b of the lower working portion 104 of the second working member 36 define a second receiving space X2 therebetween for receiving the lower blocking portion 110 of the second rail 24 (or more particularly of the base 92), wherein the lower blocking portion 110 has a smaller size than the second receiving space X2.

Preferably, when the second working member 36 is in the first state S1 (see FIG. 4), the first extension section 102a of the upper working portion 102 of the second working member 36 is blocked in the second pivoting direction R2 by the upper blocking portion 108 of the second rail 24 and thus produces a position-limiting effect. Similarly, once the second working member 36 is pivoted from the first state S1 to the second state S2 (see FIG. 5), the first extension section 104a of the lower working portion 104 of the second working member 36 is blocked in the first pivoting direction R1 by the lower blocking portion 110 of the second rail 24 and thus produces a position-limiting effect.

Preferably, referring back to FIG. 3, one of the second working member 36 and the base 92 has at least one retaining feature 112 (such as but not limited to a rib) for providing frictional resistance between the second working member 36 and the base 92 while the second working member 36 is being pivoted with respect to the base 92, thereby helping to retain the second working member 36 in the first state S1 or the second state S2.

Figure 6:
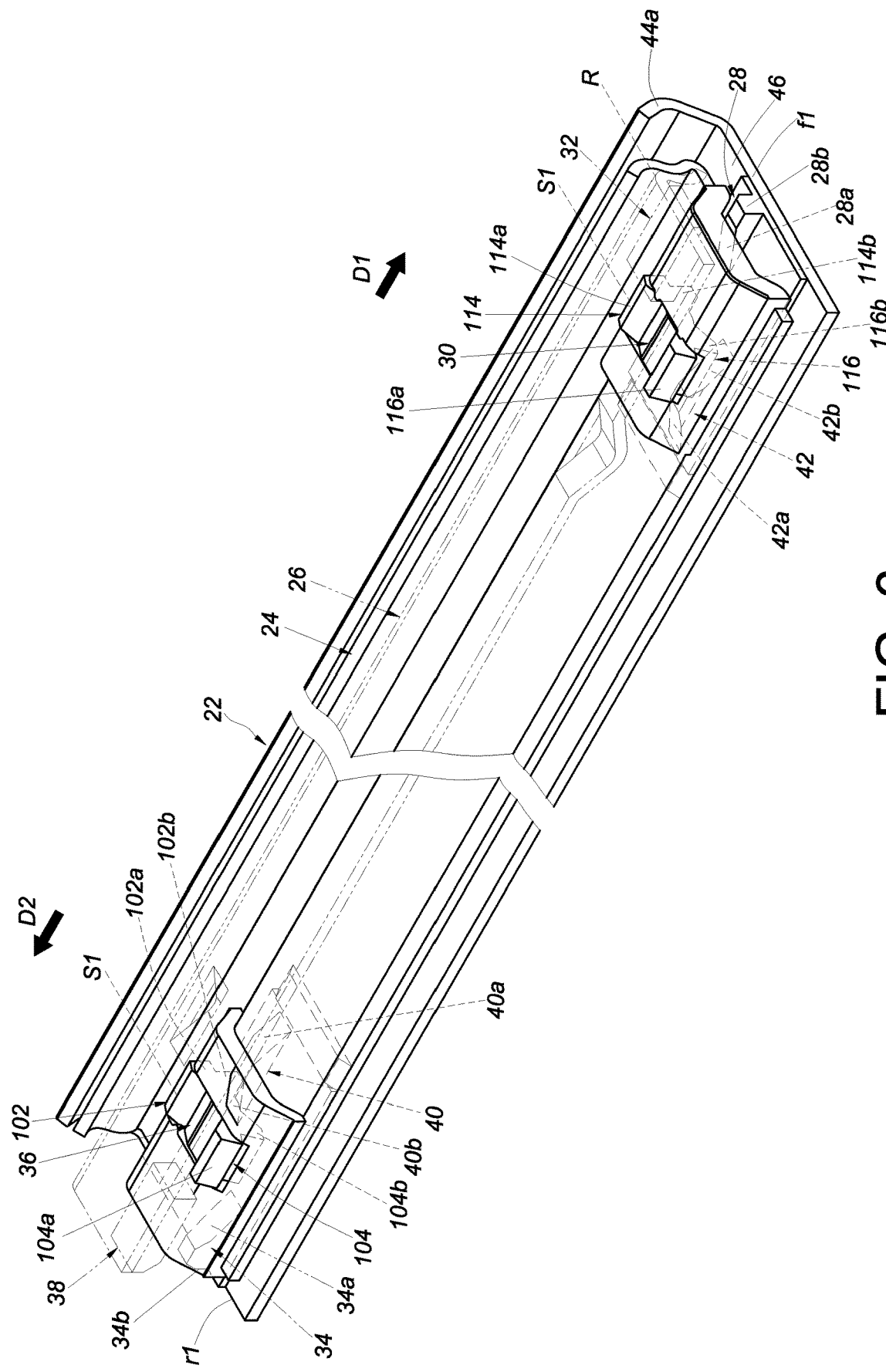
FIG. 6 is a schematic view showing that the slide rail assembly according to the embodiment of the present invention is in a retracted state.

FIG. 6 shows the slide rail assembly in a retracted state. Preferably, the first working member 30 corresponds to an intermediate position between the first auxiliary structure 28 and the second guiding feature 42 of the first rail 22, and the second working member 36 corresponds to an intermediate position between the second auxiliary structure 34 and the first guiding feature 40 of the first rail 22. Please note that FIG. 6 omits the first slide facilitating device 60, the second slide facilitating device 70, the lower wall 44b of the first rail 22, the lower wall 56b of the second rail 24, and the lower wall 66b of the third rail 26.

More specifically, when the third rail 26 is at a retracted position R with respect to the first rail 22, the second rail 24 is retracted with respect to the first rail 22, and the first working member 30 is in the first state S1. For example, while the first working member 30 is in the first state S1 with respect to the second rail 24, the upper working portion 114 of the first working member 30 is sunken toward and hence close to the first rail 22 (or more particularly its longitudinal wall 46), with the second extension section 114b of the upper working portion 114 corresponding to the first auxiliary section 28a of the first auxiliary structure 28, and the first extension section 114a of the upper working portion 114 being offset from the first contact feature 32 on the third rail 26; on the other hand, the lower working portion 116 of the first working member 30 is tilted up toward and hence close to the third rail 26 (or more particularly its longitudinal wall 68), with the second extension section 116b of the lower working portion 116 being offset from the second guiding feature 42 of the first rail 22.

Preferably, the second working member 36 is also in the first state S1 when the third rail 26 is at the retracted position R with respect to the first rail 22. For example, while the second working member 36 is in the first state S1 with respect to the second rail 24, the upper working portion 102 of the second working member 36 is sunken toward and hence close to the first rail 22 (or more particularly its longitudinal wall 46), with the second extension section 102b of the upper working portion 102 corresponding to the second guiding section 40b of the first guiding feature 40; on the other hand, the lower working portion 104 of the second working member 36 is tilted up toward and hence close to the third rail 26 (or more particularly its longitudinal wall 68), with the first extension section 104a of the lower working portion 104 corresponding to the second contact feature 38 on the third rail 26.

Figure 7:
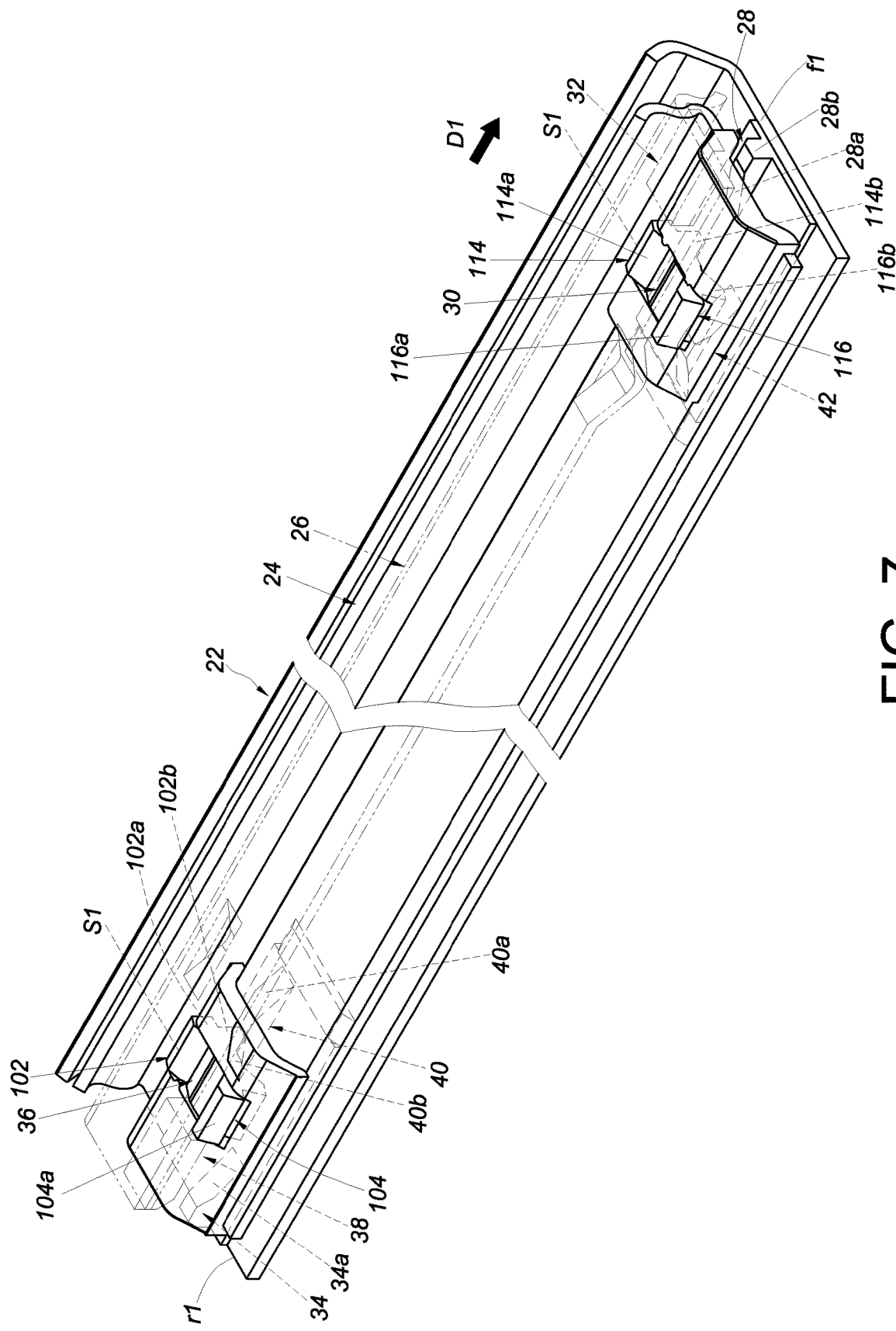
FIG. 7 is a schematic view showing that the third rail according to the embodiment of the present invention is able to displace the second rail in a first direction.

Referring to FIG. 6 and FIG. 7, the third rail 26 can be displaced from the retracted position R in a first direction D1 or a second direction D2, which is the opposite direction of the first direction D1. Here, by way of example, the third rail 26 is displaced in the first direction D1 to begin with. In the course in which the third rail 26 is displaced in the first direction D1 to a first extended position, the second contact feature 38 on the third rail 26 is brought into contact with the lower working portion 104 (or more particularly its first extension section 104a) of the second working member 36, which is now in the first state S1, and can therefore help drive the second rail 24 into displacement in the first direction D1; in other words, the second rail 24 and the third rail 26 will be able to be displaced simultaneously in the first direction D1.

Figure 8:
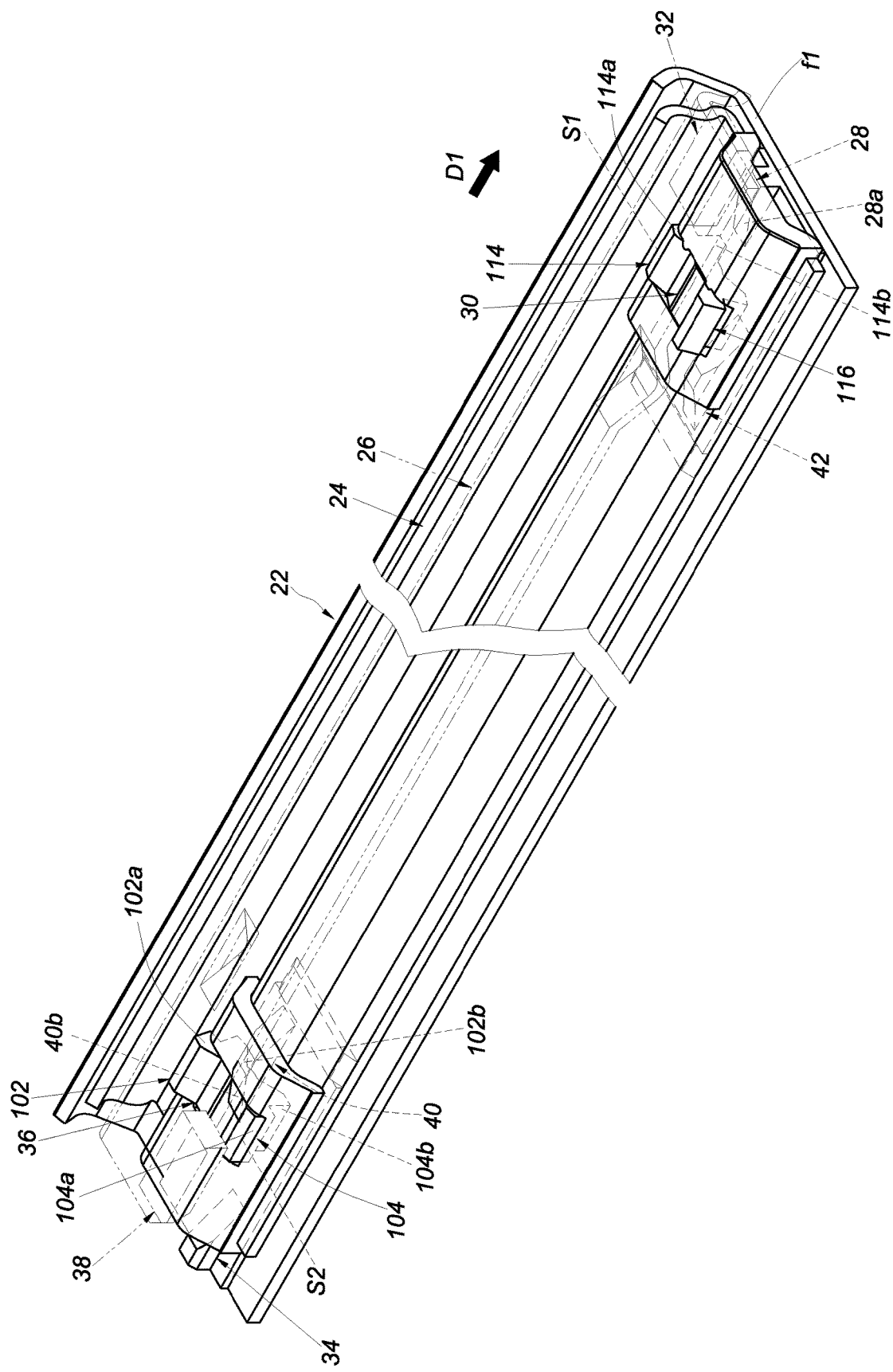
FIG. 8 is a schematic view showing that the third rail and the second rail according to the embodiment of the present invention are displaced in the first direction.

Referring to FIG. 7 and FIG. 8, in the course in which the second rail 24 is displaced in the first direction D1 along with the third rail 26, the upper working portion 102 (or more particularly its second extension section 102b) of the second working member 36 in the first state S1 (see FIG. 7) is brought into contact with the second guiding section 40b of the first guiding feature 40, and the second working member 36 is switched from the first state S1 (see FIG. 7) to the second state S2 (see FIG. 8) as a result. As shown in FIG. 8, the upper working portion 102 of the second working member 36 is configured to be guided by the second guiding section 40b of the first guiding feature 40 and will eventually move past the first guiding feature 40 such that the lower working portion 104 (or more particularly its first extension section 104a) of the second working member 36 no longer corresponds to, but is offset from, the second contact feature 38 on the third rail 26, thereby allowing the second contact feature 38 on the third rail 26 to move past the second working member 36 (which is now in the second state S2) in the first direction D1; that is to say, the second rail 24 and the third rail 26 will no longer be able to be simultaneously displaced in the first direction D1.

Figure 9:
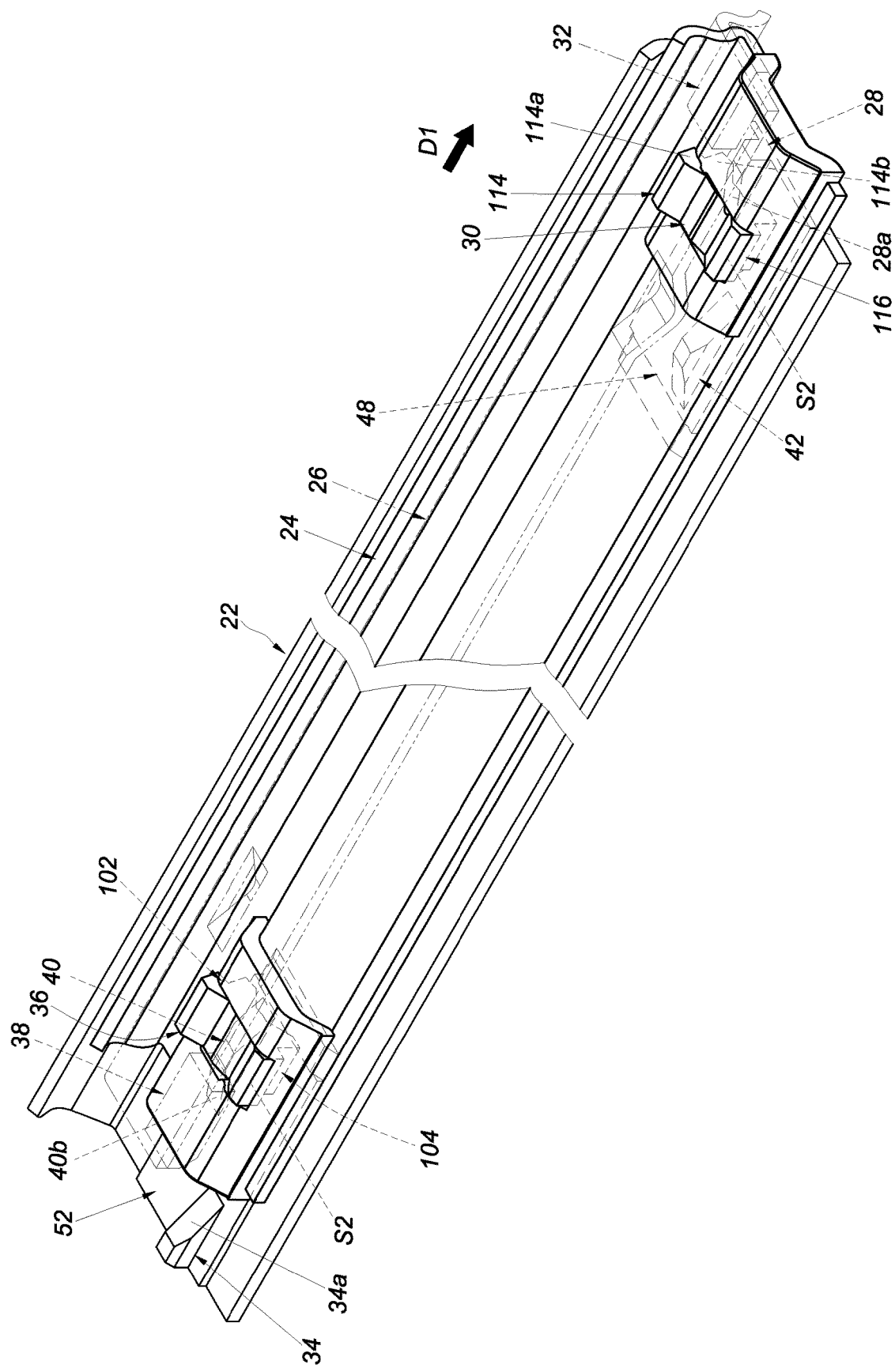
FIG. 9 is a schematic view showing that the third rail and the second rail according to the embodiment of the present invention are further displaced in the first direction.

Referring to FIG. 8 and FIG. 9, while the third rail 26 is being further displaced in the first direction D1, the second rail 24 is displaced in the first direction D1 differentially with respect to the third rail 26. During the process, the upper working portion 114 (or more particularly its second extension section 114b) of the first working member 30 in the first state S1 is brought into contact with the first auxiliary section 28a of the first auxiliary structure 28, thereby switching the first working member 30 from the first state S1 (see FIG. 8) to the second state S2 (see FIG. 9). As shown in FIG. 9, the upper working portion 114 of the first working member 30 is configured to be guided by the first auxiliary section 28a of the first auxiliary structure 28 and will eventually move past the first auxiliary structure 28, and once the first working member 30 enters the second state S2, the upper working portion 114 of the first working member 30 is no longer offset from the first contact feature 32 on the third rail 26. In other words, the upper working portion 114 (or more particularly its first extension section 114a) of the first working member 30 corresponds to the first contact feature 32 on the third rail 26 when the first working member 30 is in the second state S2.

Figure 10:
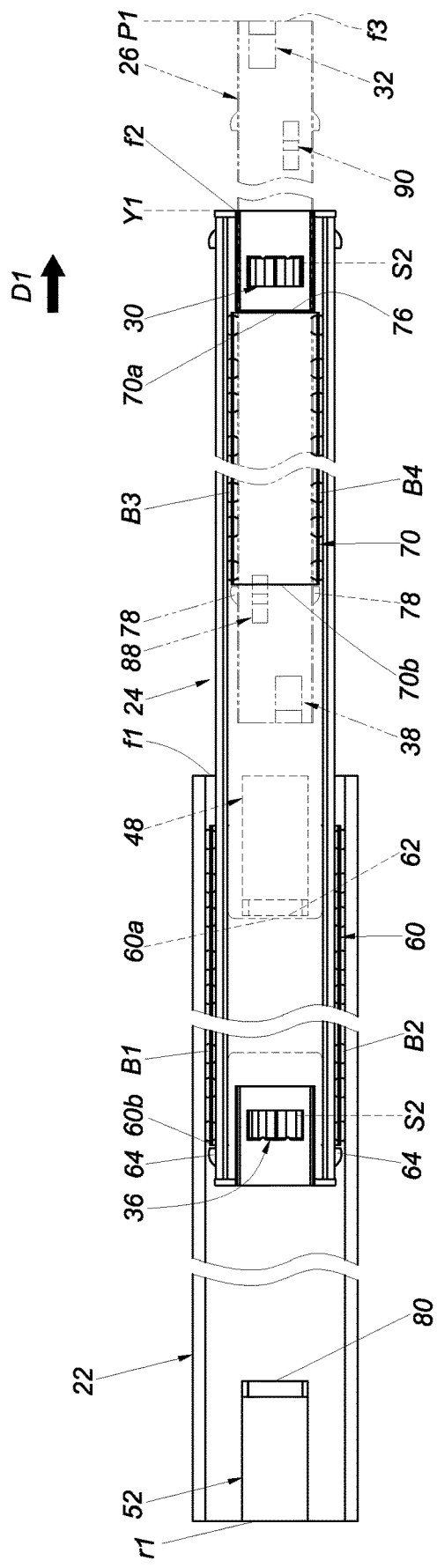
FIG. 10 is a schematic view showing that the third rail and the second rail according to the embodiment of the present invention are further displaced in the first direction and thus bring the slide rail assembly into an extended state.

Referring to FIG. 9 and FIG. 10, when the third rail 26 reaches the first extended position P1 after being further displaced with respect to the first rail 22 in the first direction D1, the second rail 24 arrives at a first predetermined position Y1, and the slide rail assembly is in an extended state (such as but not limited to a fully extended state).

Preferably, when the second rail 24 is at the first predetermined position Y1 with respect to the first rail 22, a front section 60a and a rear section 60b of the first slide facilitating device 60 are located between and abut respectively against the first blocking feature 62 and the second blocking feature 64; for example, the front section 60a of the first slide facilitating device 60 abuts against the first blocking feature 62 of the first rail 22 while the second blocking feature 64 of the second rail 24 abuts against the rear section 60b of the first slide facilitating device 60. It is also preferable that when the third rail 26 is at the first extended position P1, a front section 70a and a rear section 70b of the second slide facilitating device 70 are located between and abut respectively against the third blocking feature 76 and the fourth blocking feature 78; for example, the front section 70a of the second slide facilitating device 70 abuts against the third blocking feature 76 of the second rail 24 while the fourth blocking feature 78 of the third rail 26 abuts against the rear section 70b of the second slide facilitating device 70. It is worth mentioning that FIG. 10 omits the first auxiliary structure 28 and the second guiding feature 42 on the first component 48 and the second auxiliary structure 34 and the first guiding feature 40 on the second component 52.

Figure 11:
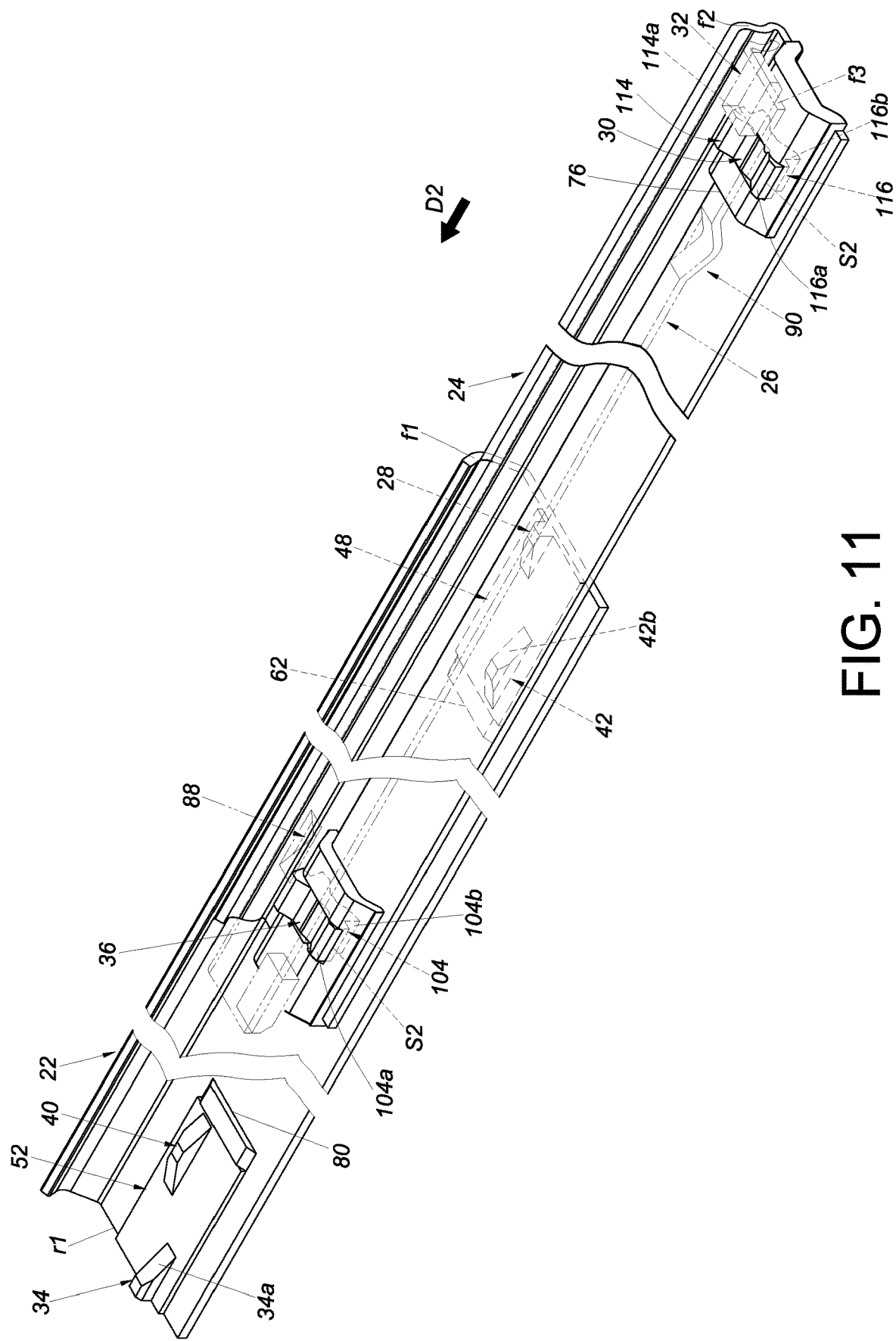
FIG. 11 is a schematic view showing that the third rail according to the embodiment of the present invention is able to drive and thereby retract the second rail in a second direction with respect to the first rail.
Figure 12:
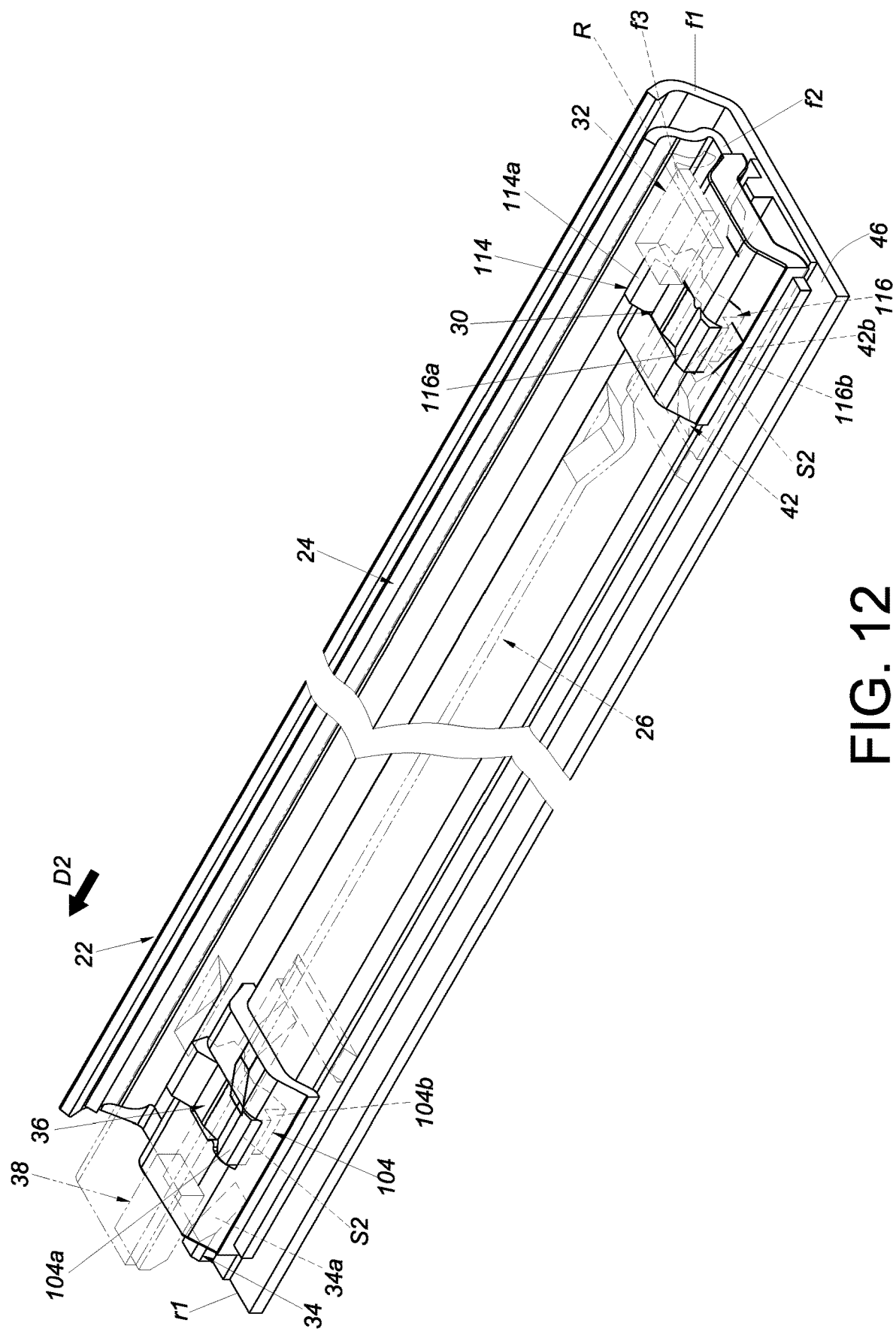
FIG. 12 is a schematic view showing that the slide rail assembly according to the embodiment of the present invention is in the retracted state.

Referring to FIG. 11 and FIG. 12, in the course in which the third rail 26 is displaced from the first extended position P1 to the retracted position R in the second direction D2, the first contact feature 32 on the third rail 26 is brought into contact with the upper working portion 114 (or more particularly its first extension section 114a) of the first working member 30, which is now in the second state S2, and can hence drive and thereby retract the second rail 24 with respect to the first rail 22 in the second direction D2, bringing the slide rail assembly back to the retracted state. It is worth mentioning that when the third rail 26 arrives again at the retracted position R with respect to the first rail 22, both the first working member 30 and the second working member 36 are in the second state S2.

Referring to FIG. 12, when the first working member 30 is in the second state S2 with respect to the second rail 24, the lower working portion 116 (or more particularly its second extension section 116b) of the first working member 30 corresponds to the second guiding section 42b of the second guiding feature 42; and when the second working member 36 is in the second state S2 with respect to the second rail 24, the lower working portion 104 (or more particularly its second extension section 104b) of the second working member 36 corresponds to the second auxiliary section 34a of the second auxiliary structure 34. The third rail 26 in this state can be displaced with respect to the first rail 22 from the retracted position R in the second direction D2. While the third rail 26 is being displaced to a second extended position in the second direction D2, the first contact feature 32 on the third rail 26 is brought into contact with the upper working portion 114 (or more particularly its first extension section 114a) of the first working member 30, which is now in the second state S2, and can therefore help drive the second rail 24 into displacement in the second direction D2; in other words, the second rail 24 and the third rail 26 will be able to be displaced simultaneously in the second direction D2.

Figure 13:
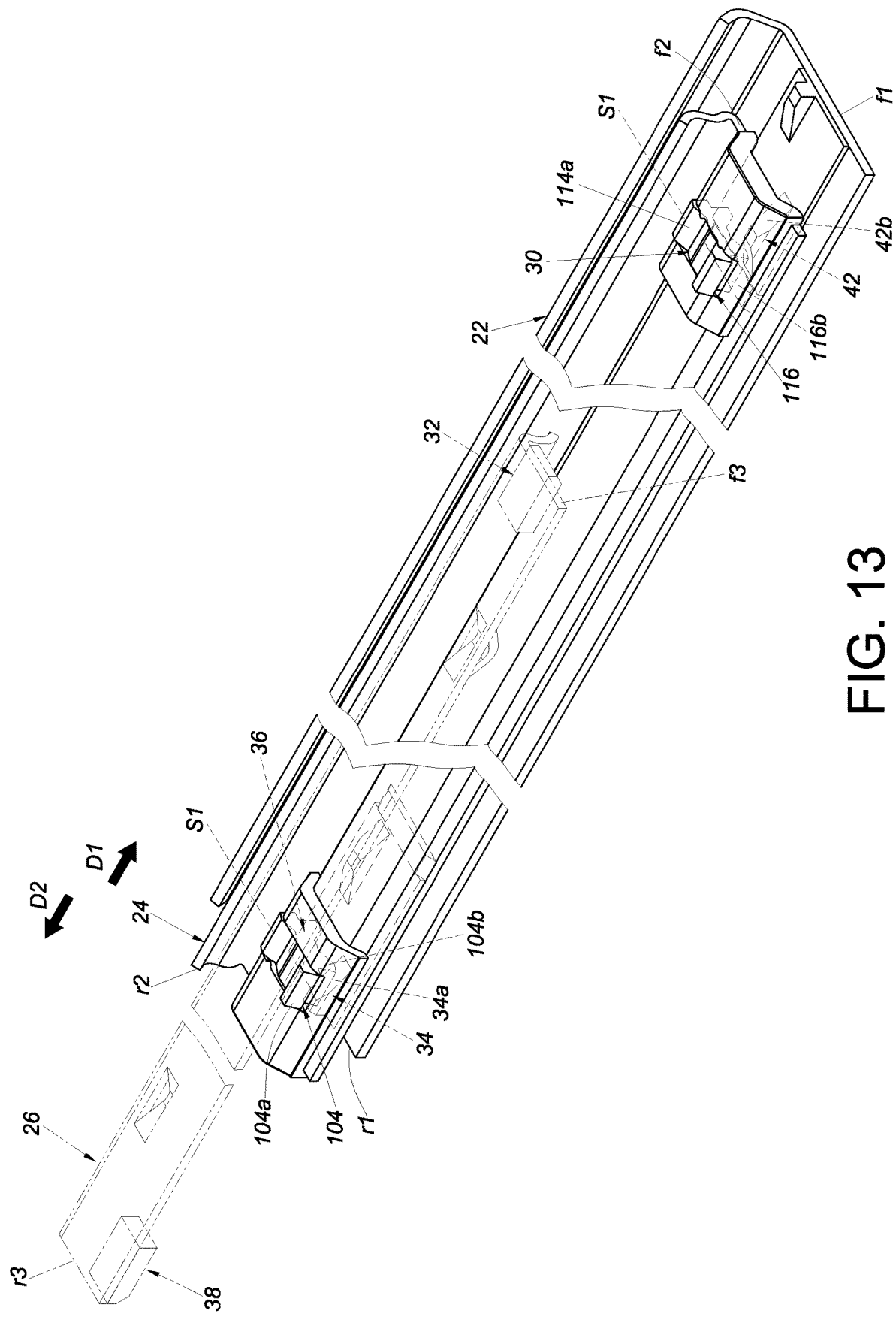
FIG. 13 is a schematic view showing that the third rail and the second rail according to the embodiment of the present invention can be displaced in the second direction.

Referring to FIG. 12 and FIG. 13, in the course in which the third rail 26 is displaced from the retracted position R in the second direction D2, the lower working portion 104 (or more particularly its second extension section 104b) of the second working member 36 in the second state S2 is brought into contact with the second auxiliary section 34a of the second auxiliary structure 34, and the second working member 36 is thus switched from the second state S2 (see FIG. 12) to the first state S1 (see FIG. 13). Moreover, in the course in which the second rail 24 is displaced in the second direction D2, the lower working portion 116 (or more particularly its second extension section 116b) of the first working member 30 in the second state S2 is brought into contact with the second guiding feature 42 (or more particularly its second guiding section 42b), and the first working member 30 is thus switched from the second state S2 (see FIG. 12) to the first state S1 (see FIG. 13), allowing the first contact feature 32 to move past the first working member 30 (or more particularly its first extension section 114a), which is now in the first state S1, in the second direction D2, as shown in FIG. 13.

Figure 14:
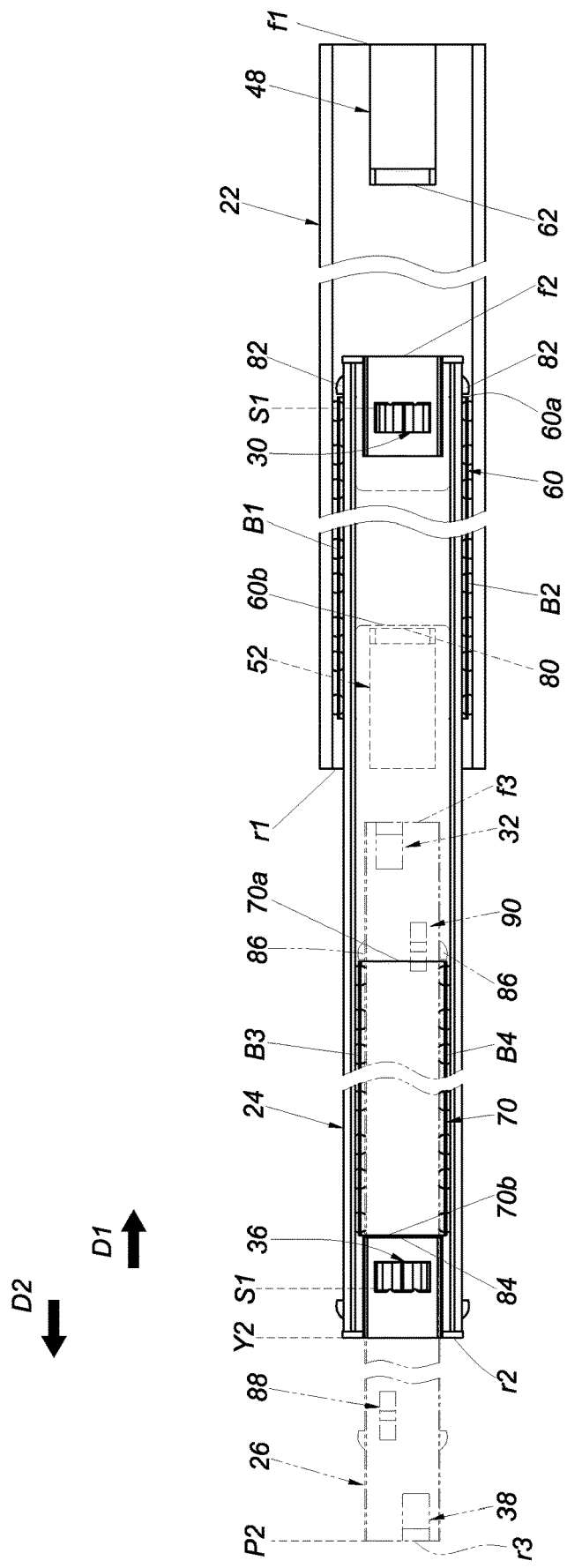
FIG. 14 is a schematic view showing that the third rail and the second rail according to the embodiment of the present invention are displaced in the second direction and thus bring the slide rail assembly into an extended state.

Referring to FIG. 14, when the third rail 26 reaches the second extended position P2 after being further displaced with respect to the first rail 22 in the second direction D2, the second rail 24 arrives at a second predetermined position Y2, and the slide rail assembly is in an extended state (such as but not limited to a fully extended state).

Preferably, when the second rail 24 is at the second predetermined position Y2 with respect to the first rail 22, the rear section 60b and the front section 60a of the first slide facilitating device 60 are located between and abut respectively against the fifth blocking feature 80 and the sixth blocking feature 82; for example, the rear section 60b of the first slide facilitating device 60 abuts against the fifth blocking feature 80 of the first rail 22 while the sixth blocking feature 82 of the second rail 24 abuts against the front section 60a of the first slide facilitating device 60. It is also preferable that when the third rail 26 is at the second extended position P2, the rear section 70b and the front section 70a of the second slide facilitating device 70 are located between and abut respectively against the seventh blocking feature 84 and the eighth blocking feature 86; for example, the rear section 70b of the second slide facilitating device 70 abuts against the seventh blocking feature 84 of the second rail 24 while the eighth blocking feature 86 of the third rail 26 abuts against the front section 70a of the second slide facilitating device 70. It is worth mentioning that FIG. 14 omits the first auxiliary structure 28 and the second guiding feature 42 on the first component 48 and the second auxiliary structure 34 and the first guiding feature 40 on the second component 52.

Referring sequentially to FIG. 14 and FIG. 13, in the course in which the third rail 26 is displaced from the second extended position P2 to the retracted position R in the first direction D1, the second contact feature 38 on the third rail 26 is brought into contact with the lower working portion 104 (or more particularly its first extension section 104a) of the second working member 36, which is now in the first state S1, and can hence drive and thereby retract the second rail 24 with respect to the first rail 22 in the first direction D1, bringing the slide rail assembly to the retracted state again (see FIG. 6). The working principle involved is similar to that shown in FIG. 11 and FIG. 12.

Figure 15:
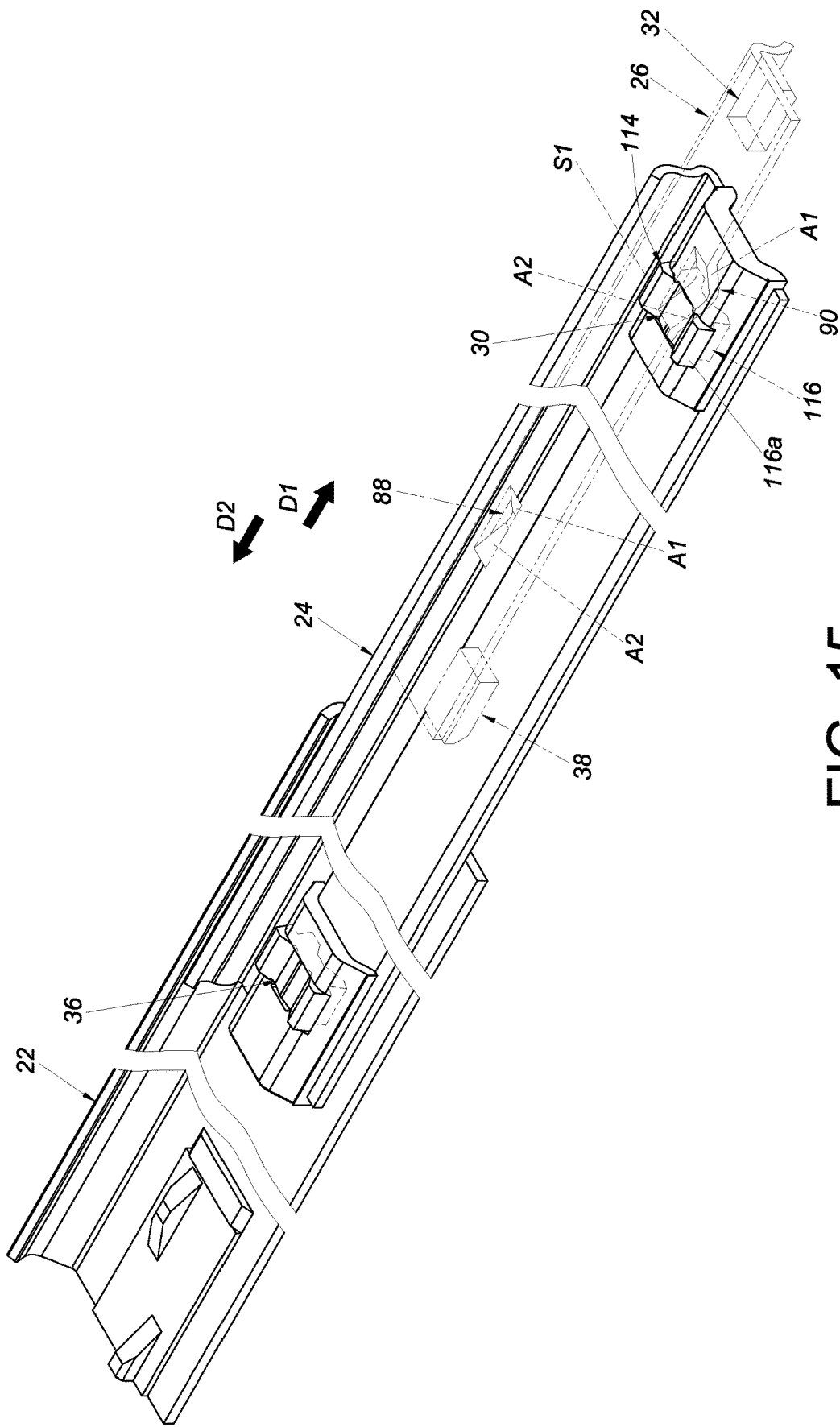
FIG. 15 is a schematic view showing that the working member of the second rail is in an unexpected state, and that the contact feature on the third rail is adjacent to the working member.
Figure 16:
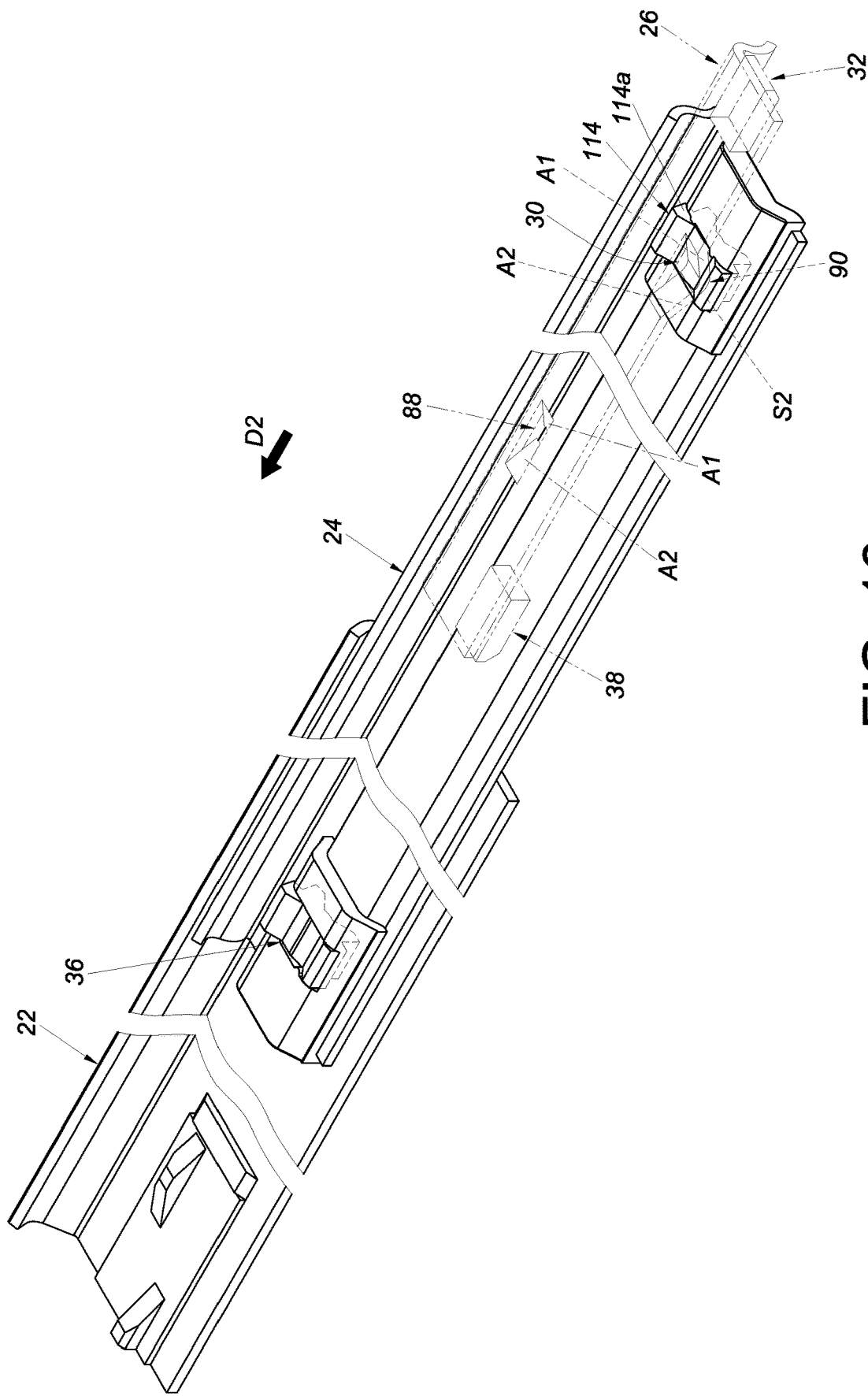
FIG. 16 is a schematic view showing that the working member of the second rail is driven into a predetermined state by the contact feature on the third rail.

FIG. 15 and FIG. 16 show a case in which the third rail 26 is being displaced with respect to the first rail 22 in the first direction D1 toward the first extended position P1, and yet in which an unexpected force application (due to some man-made or external factor) has switched the first working member 30 from the second state S2 (e.g., a predetermined state) to the first state S1 (e.g., an unexpected state) such that when the third rail 26 is subsequently displaced from the first extended position P1 in the second direction D2, the first contact feature 32 on the third rail 26 is unable to contact the first working member 30. By operating, i.e., displacing, the third rail 26, however, a user can bring the second actuating feature 90 (or more particularly its first actuating section A1 or second actuating section A2) into contact with the lower working portion 116 (or more particularly its first extension section 116a) of the first working member 30, which is now in the first state S1, in order for the second actuating feature 90 to switch the first working member 30 from the first state S1 (see FIG. 15) to the second state S2 (see FIG. 16), ensuring that while the third rail 26 is being displaced from the first extended position P1 in the second direction D2, the first contact feature 32 on the third rail 26 will contact the upper working portion 114 (or more particularly its first extension section 114a) of the first working member 30 in the second state S2 so as to drive and thereby retract the second rail 24 with respect to the first rail 22 in the second direction D2.

By the same working principle, a user can operate, i.e., displace, the third rail 26 so that the first actuating feature 88 (or more particularly its first actuating section A1 or second actuating section A2) switches the second working member 36 from the second state S2 to the first state S1, ensuring that while the third rail 26 is being displaced from the second extended position P2 in the first direction D1, the second contact feature 38 on the third rail 26 will contact the second working member 36 in the first state S1 so as to drive and thereby retract the second rail 24 with respect to the first rail 22 in the first direction D1.

It can be known from the above that the embodiment described above preferably has the following features:
1. While the third rail 26 is being retracted with respect to the first rail 22 from an extended position (e.g., the first extended position P1 or the second extended position P2), one of the contact features will contact the corresponding working member in the predetermined state to ensure that the second rail 24 can be retracted with respect to the first rail 22.
2. The third rail 26 as well as the second rail 24 can be pulled out with respect to the first rail 22 in two opposite directions (e.g., the first direction D1 and the second direction D2) to enable two-way opening without producing any negative effect on the distance for which each of the second rail 24 and the third rail 26 can be displaced.

While the present invention has been disclosed through the foregoing embodiment, it should be understood that the embodiment is not intended to be restrictive of the scope of the invention. The scope of the patent protection sought by the applicant is defined by the appended claims.

What is claimed is:
1. A slide rail assembly, comprising:
a first rail;
a second rail displaceable with respect to the first rail;
a third rail displaceable with respect to the second rail;
a first auxiliary structure disposed on the first rail;
a first working member movably mounted on the second rail and configured to be in either one of a first state and a second state with respect to the second rail;
a second working member movably mounted on the second rail and a second contact feature disposed on the third rail; and
a first contact feature disposed on the third rail;
wherein when the third rail is at a retracted position with respect to the first rail, the second rail is retracted with respect to the first rail, and the first working member is in the first state;
wherein while the third rail is being displaced from the retracted position to a first extended position in a first direction, the first working member in the first state is brought into contact with the first auxiliary structure and is thus switched from the first state to the second state;
wherein while the third rail is being displaced from the first extended position to the retracted position in a second direction, which is the opposite direction of the first direction, the first contact feature on the third rail is brought into contact with the first working member in the second state so as to drive and thereby retract the second rail with respect to the first rail in the second direction;
wherein the second working member is configured to be in either one of the first state and the second state with respect to the second rail; the second working member is in the first state when the third rail is at the retracted position with respect to the first rail; and while the third rail is being displaced from the retracted position to the first extended position in the first direction, the second contact feature on the third rail is brought into contact with the second working member in the first state to help displace the second rail in the first direction.

2. The slide rail assembly of claim 1, further comprising a first guiding feature disposed on the first rail, wherein while the second rail is being displaced in the first direction, the second working member in the first state is brought into contact with the first guiding feature and is thus switched from the first state to the second state, allowing the second contact feature to move past the second working member in the second state in the first direction.

3. The slide rail assembly of claim 2, wherein the first auxiliary structure is disposed adjacent to a front portion of the first rail, and the first guiding feature is disposed adjacent to a rear portion of the first rail.

4. The slide rail assembly of claim 3, wherein the first rail includes an upper wall, a lower wall, and a longitudinal wall connected between the upper wall and the lower wall of the first rail, and both the first auxiliary structure and the first guiding feature are adjacent to the upper wall of the first rail.

5. The slide rail assembly of claim 4, further comprising a second auxiliary structure and a second guiding feature, wherein while the third rail is being displaced from the retracted position to a second extended position in the second direction, the second working member in the second state is brought into contact with the second auxiliary structure and is thus switched from the second state to the first state; and while the third rail is being displaced from the second extended position to the retracted position in the first direction, the second contact feature on the third rail is brought into contact with the second working member in the first state so as to drive and thereby retract the second rail with respect to the first rail in the first direction.

6. The slide rail assembly of claim 5, wherein while the third rail is being displaced from the retracted position to the second extended position in the second direction, the first contact feature on the third rail is brought into contact with the first working member in the second state to displace the second rail in the second direction.

7. The slide rail assembly of claim 6, wherein while the second rail is being displaced in the second direction, the first working member in the second state is brought into contact with the second guiding feature and is thus switched from the second state to the first state, allowing the first contact feature to move past the first working member in the first state in the second direction.

8. The slide rail assembly of claim 6, wherein the second auxiliary structure is disposed adjacent to the rear portion of the first rail, and the second guiding feature is disposed adjacent to the front portion of the first rail.

9. The slide rail assembly of claim 8, wherein both the second auxiliary structure and the second guiding feature are adjacent to the lower wall of the first rail.

10. The slide rail assembly of claim 5, further comprising a first slide facilitating device movably mounted between the first rail and the second rail and a second slide facilitating device movably mounted between the second rail and the third rail.

11. The slide rail assembly of claim 10, wherein the first rail is provided with a first blocking feature, the second rail is provided with a second blocking feature, and when the second rail is at a first predetermined position, a front section and a rear section of the first slide facilitating device are located between and abut respectively against the first blocking feature and the second blocking feature; and wherein the second rail is provided with a third blocking feature, the third rail is provided with a fourth blocking feature, and when the third rail is at the first extended position, a front section and a rear section of the second slide facilitating device are located between and abut respectively against the third blocking feature and the fourth blocking feature.

12. The slide rail assembly of claim 11, wherein the first rail is provided with a fifth blocking feature, the second rail is provided with a sixth blocking feature, and when the second rail is at a second predetermined position, the rear section and the front section of the first slide facilitating device are located between and abut respectively against the fifth blocking feature and the sixth blocking feature; and wherein the second rail is provided with a seventh blocking feature, the third rail is provided with an eighth blocking feature, and when the third rail is at the second extended position, the rear section and the front section of the second slide facilitating device are located between and abut respectively against the seventh blocking feature and the eighth blocking feature.

13. The slide rail assembly of claim 1, wherein the first working member and the second working member are pivotally connected to the second rail.

14. The slide rail assembly of claim 1, wherein the first working member is disposed adjacent to a front portion of the second rail, and the second working member is disposed adjacent to a rear portion of the second rail.

15. The slide rail assembly of claim 1, wherein the first contact feature is disposed adjacent to a front portion of the third rail, and the second contact feature is disposed adjacent to a rear portion of the third rail.

16. The slide rail assembly of claim 15, wherein the third rail includes an upper wall, a lower wall, and a longitudinal wall connected between the upper wall and the lower wall of the third rail, and the first contact feature and the second contact feature are adjacent to the upper wall and the lower wall of the third rail respectively.

17. A slide rail assembly, comprising:
a first rail;
a second rail displaceable with respect to the first rail;
a third rail displaceable with respect to the second rail;
a working member movably mounted on the second rail and switchable between two states with respect to the second rail;
a second working member movably mounted on the second rail and a second contact feature disposed on the third rail; and
a contact feature disposed on the third rail;
wherein the third rail is displaceable from a retracted position to a first extended position in a first direction;
wherein while the third rail is being displaced from the first extended position to the retracted position in a second direction, which is the opposite direction of the first direction, the contact feature on the third rail is brought into contact with the working member in one of the two states so as to drive and thereby retract the second rail with respect to the first rail in the second direction,
wherein the second working member is configured to be in either one of the first state and the second state with respect to the second rail; the second working member is in the first state when the third rail is at the retracted position with respect to the first rail; and while the third rail is being displaced from the retracted position to the first extended position in the first direction, the second contact feature on the third rail is brought into contact with the second working member in the first state to help displace the second rail in the first direction.

18. The slide rail assembly of claim 17, wherein the working member is pivotally connected with respect to the second rail via a shaft, the shaft extends in a direction substantially identical to a length direction of the second rail, an auxiliary structure is disposed on the first rail, and while the third rail is being displaced from the retracted position to the first extended position in the first direction, the working member in the other one of the two states is brought into contact with the auxiliary structure and is thus switched from the other one to the one of the two states.

19. The slide rail assembly of claim 17, further comprising a guiding feature disposed on the first rail, wherein while the third rail is being displaced from the retracted position to a second extended position in the second direction, the contact feature on the third rail is brought into contact with the working member in the one of the two states to displace the second rail in the second direction; and while the second rail is being displaced in the second direction, the working member in the one of the two states is brought into contact with the guiding feature and is thus switched from the one to the other one of the two states, allowing the contact feature to move past the working member in the other one of the two states in the second direction.

* * * * *